(12) United States Patent
Ota et al.

(10) Patent No.: US 8,829,513 B2
(45) Date of Patent: Sep. 9, 2014

(54) OXIDE SEMICONDUCTOR INCLUDING GA, IN, ZN, AND O AND A THIN FILM TRANSISTOR AND A DISPLAY WITH THE OXIDE SEMICONDUCTOR INCLUDING GA, IN, ZN, AND O

(75) Inventors: Yoshifumi Ota, Osaka (JP); Hirohiko Nishiki, Osaka (JP); Yoshimasa Chikama, Osaka (JP); Takeshi Hara, Osaka (JP); Tetsuya Aita, Osaka (JP); Masahiko Suzuki, Osaka (JP); Okifumi Nakagawa, Osaka (JP); Kazuo Nakagawa, Osaka (JP); Yuuji Mizuno, Osaka (JP); Hinae Mizuno, legal representative, Yamato (JP); Michiko Takei, Osaka (JP); Yoshiyuki Harumoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 214 days.

(21) Appl. No.: 13/391,638

(22) PCT Filed: Mar. 29, 2010

(86) PCT No.: PCT/JP2010/055582
§ 371 (c)(1),
(2), (4) Date: Oct. 5, 2012

(87) PCT Pub. No.: WO2011/024501
PCT Pub. Date: Mar. 3, 2011

(65) Prior Publication Data
US 2013/0193430 A1     Aug. 1, 2013

(30) Foreign Application Priority Data
Aug. 31, 2009   (JP) .................... 2009-200341

(51) Int. Cl.
| | | |
|---|---|---|
| *H01L 27/12* | (2006.01) | |
| *H01L 29/786* | (2006.01) | |
| *H01L 27/32* | (2006.01) | |
| *H01L 33/00* | (2010.01) | |
| *G02F 1/1368* | (2006.01) | |

(52) U.S. Cl.
CPC ........ *H01L 29/7869* (2013.01); *H01L 27/3258* (2013.01); *H01L 33/0041* (2013.01); *G02F 1/1368* (2013.01)
USPC ........................................................... 257/43

(58) Field of Classification Search
CPC .................................................. H01L 27/3258
USPC ............... 257/43, E21.409, 40; 438/104, 151
See application file for complete search history.

(56) References Cited

U.S. PATENT DOCUMENTS

2007/0115219 A1    5/2007  Inoue
(Continued)

FOREIGN PATENT DOCUMENTS

JP          2007-142195 A       6/2007
(Continued)

OTHER PUBLICATIONS
Official Communication issued in International Patent Application No. PCT/JP2010/055582, mailed on May 18, 2010.
(Continued)

*Primary Examiner* — Nathan Ha
(74) *Attorney, Agent, or Firm* — Keating & Bennett, LLP

(57) ABSTRACT

The present invention provides an oxide semiconductor that realizes a TFT excellent in electric properties and process resistance, a TFT comprising a channel layer formed of the oxide semiconductor, and a display device equipped with the TFT. The oxide semiconductor of the present invention is an oxide semiconductor for a thin film transistor, wherein the oxide semiconductor contains Ga (gallium), In (indium), Zn (zinc), and O (oxygen) as constituent atoms, and the oxide semiconductor has Zn atomic composition satisfying the equation of $0.01 \leq Zn/(In+Zn) \leq 0.22$.

5 Claims, 5 Drawing Sheets

(56) References Cited

U.S. PATENT DOCUMENTS

| | | |
|---|---|---|
| 2007/0252147 A1 | 11/2007 | Kim et al. |
| 2008/0291350 A1 | 11/2008 | Hayashi et al. |
| 2009/0189153 A1 | 7/2009 | Iwasaki et al. |
| 2009/0237000 A1 | 9/2009 | Inoue |
| 2010/0044701 A1 | 2/2010 | Sano et al. |
| 2010/0044703 A1 | 2/2010 | Yabuta et al. |
| 2010/0051936 A1 | 3/2010 | Hayashi et al. |
| 2010/0065837 A1 | 3/2010 | Omura et al. |
| 2010/0163860 A1 | 7/2010 | Yano et al. |
| 2010/0295042 A1* | 11/2010 | Yano et al. .................. 257/43 |
| 2011/0065269 A1 | 3/2011 | Hayashi et al. |

FOREIGN PATENT DOCUMENTS

| | | |
|---|---|---|
| JP | 2007-281409 A | 10/2007 |
| JP | 2008-166716 A | 7/2008 |
| JP | 2008-235871 A | 10/2008 |
| JP | 2008-277326 A | 11/2008 |
| WO | 2009/093625 A1 | 7/2009 |

OTHER PUBLICATIONS

Ohta et al.; "Oxide Semiconductor, Thin Film Transistor Array Substrate and Production Method Thereof, and Display Device"; U.S. Appl. No. 13/377,824, filed Dec. 13, 2011.

* cited by examiner

US 8,829,513 B2

OXIDE SEMICONDUCTOR INCLUDING GA, IN, ZN, AND O AND A THIN FILM TRANSISTOR AND A DISPLAY WITH THE OXIDE SEMICONDUCTOR INCLUDING GA, IN, ZN, AND O

TECHNICAL FIELD

The present invention relates to an oxide semiconductor, a thin film transistor (hereinafter, also referred to as TFT), and a display device. More specifically, the present invention relates to an oxide semiconductor suitably used on a TFT, a TFT comprising a channel layer formed of the oxide semiconductor, and a display device equipped with the TFT.

BACKGROUND ART

TFTs are widely used on active matrix substrates for display devices such as liquid crystal display devices. Commonly, channel layers of TFTs are made of silicon-type materials such as polycrystal silicon and amorphous silicon. Semiconductor compounds are now developed as next-generation materials which are alternative to silicon-type materials because they are capable of enhancing the electric properties of TFTs.

Patent Documents 1 and 2, for example, disclose oxide semiconductors containing In, Ga, and Zn, as semiconductor materials used in channel layers of TFTs. FIGS. 1, 10, and 18 of Patent Document 1 each disclose a phase diagram showing a preferable composition of In, Ga, and Zn in the oxide semiconductor. Patent Document 3 discloses an amorphous oxide semiconductor containing at least one of In, Ga, Al, Fe, Sn, Mg, Ca, Si, and Ge, which has a resistivity of $10^8$ $\Omega \cdot m$. Moreover, Patent Document 4 discloses an oxide semiconductor containing at least one of In, Zn, and Sn.

Patent Document 5 discloses a semiconductor thin film comprising an amorphous film containing zinc oxide and indium oxide, which has a carrier density of $10^{+17}$ $cm^{-3}$ or lower, a Hall mobility of 2 $cm^2/V \cdot sec$ or more, and an energy band gap of 2.4 eV or more. Its preferable composition disclosed in Patent Document 5 is Zn/(Zn+In)=0.51 to 0.80. Moreover, Patent Document 6 discloses a semiconductor device in which a channel layer is constituted by $x(Ga_2O_3) \cdot y(In_2O_3) \cdot z(ZnO)$ that satisfies about $0.75 \leq x/y \leq$ about 3.15 and about $0.55 \leq y/z \leq$ about 1.70.

[Patent Document 1]
Japanese Kokai Publication No. 2007-281409 (JP-A 2007-281409)
[Patent Document 2]
Japanese Kokai Publication No. 2008-277326 (JP-A 2008-277326)
[Patent Document 3]
Japanese Kokai Publication No. 2008-235871 (JP-A 2008-235871)
[Patent Document 4]
Japanese Kokai Publication No. 2008-166716 (JP-A 2008-166716)
[Patent Document 5]
Japanese Kokai Publication No. 2007-142195 (JP-A 2007-142195)
[Patent Document 6]
US 2007/0252147 A1

DISCLOSURE OF INVENTION

Problems to be Solved by the Invention

Properties of an oxide semiconductor vary in accordance with the atomic composition (hereinafter, also referred to as "composition"). Accordingly, if an oxide semiconductor is used in a channel layer of a TFT, the TFT may have unstable electric properties or lowered process resistance depending on the composition of the oxide semiconductor. As above, there is still room for improvement of an oxide semiconductor for a TFT with regard to optimization of the composition.

The present invention has been devised in consideration of the state of the art and is aimed to provide an oxide semiconductor that realizes a TFT excellent in electric properties and process resistance, a TFT comprising a channel layer formed of the oxide semiconductor, and a display device equipped with the TFT.

Means for Solving the Problems

The present inventors have intensively studied about an oxide semiconductor that realizes a TFT excellent in electric properties and process resistance, and focused on an oxide semiconductor comprising Ga (gallium), In (indium), Zn (zinc), and O (oxygen) as constituent atoms. The present inventors have found out that adjustment of the composition ratio of In, Ga, Zn in the oxide semiconductor realizes a TFT excellent in electric properties and process resistance. Accordingly, the above problems have been solved and the present invention has been completed.

Namely, the present invention preferably provides an oxide semiconductor for a thin film transistor, wherein the oxide semiconductor contains Ga, In, Zn, and O as constituent atoms, and the oxide semiconductor has Zn atomic composition satisfying the equation of $0.01 \leq Zn/(In+Zn) \leq 0.22$.

Here, the oxide semiconductor of the present invention comprises Ga, In, Zn, and O as constituent atoms, and preferably consists essentially of Ga, In, Zn and O. This composition easily realizes a TFT excellent in electric properties and process resistance. In the oxide semiconductor consisting of Ga, In, Zn, and O, the amount of constituent atoms other than Ga, In, Zn, and O is less than 0.1% by weight with respect to the entire weight of the oxide semiconductor. The composition of the oxide semiconductor can be determined by Auger electron spectroscopy (AES), X-ray photoelectron spectroscopy (XPS), or the like.

A preferable method for forming the oxide semiconductor of the present invention may include, for example, depositing an oxide semiconductor by sputtering and then patterning the formed film into a desired shape by photolithography. If such a method is used, various chemicals such as an etching solution and a resist stripping solution are used in the patterning process. The oxide semiconductor comprising Ga, In, Zn, and O as constituent atoms become more reactive to chemicals along with the increase in the Zn atomic composition thereof, leading to more damage in the patterning process. Accordingly, since the oxide semiconductor has a Zn atomic composition satisfying the equation of $0.01 \leq Zn/(In+Zn) \leq 0.22$, damage to the oxide semiconductor of the present invention in the patterning process is suppressed.

In the oxide semiconductor of the present invention, if the Ga atomic composition is large and the In atomic composition is small, the mobility of the oxide semiconductor is lowered. If the mobility of the oxide semiconductor is lower than 0.1 $cm^2/Vs$, such an oxide semiconductor is not suitably used as a TFT in a display device. Accordingly, the oxide semiconductor preferably has an In atomic composition satisfying the equation of $0.25 \leq In/(In+Ga) \leq 0.99$. Such a composition allows the oxide semiconductor to have a mobility of 0.1 $cm^2/Vs$ or more.

In the oxide semiconductor of the present invention, if the Ga atomic composition is small and the In atomic composition is large, the mobility of the oxide semiconductor is increased, leading to increase in the off-state current of a TFT. The TFT having a high off-state current may fail to sufficiently exert its switching function. Accordingly, the oxide semiconductor preferably has an In atomic composition satisfying the equation of $0.01 \leq In/(In+Ga) \leq 0.60$. Such a composition keeps a margin for increase in the off-state current.

The present invention also provides a TFT comprising a channel layer formed of the oxide semiconductor of the present invention. As mentioned above, if a channel layer of a TFT is formed of the oxide semiconductor of the present invention, electric properties and the process resistance of the TFT are enhanced.

The present invention also provides a display device equipped with the TFT of the present invention. As mentioned above, since the TFT of the present invention has excellent electric properties, the display quality of the display device is enhanced. Moreover, since the TFT of the present invention has excellent process resistance, the productivity of the display device is enhanced. Examples of the display device of the present invention include various displays equipped with a TFT array substrate, such as a liquid crystal display device, an organic EL display device, an inorganic EL display device, an electrophoretic image display device, a plasma display device, and a field emission display device.

Each of the aforementioned embodiments may be appropriately combined in a scope not departing from the principles of the present invention.

Effect of the Invention

According to the oxide semiconductor, the TFT, and the display device of the present invention, it is possible to provide an oxide semiconductor realizing a TFT excellent in electric properties and process resistance, a TFT comprising a channel layer formed of the oxide semiconductor, and a display device equipped with the TFT.

MODES FOR CARRYING OUT THE INVENTION

The present invention will be described in detail below by showing embodiments and referring to drawings. The present invention is not limited only to those embodiments. It is to be noted that units are mentioned in brackets in the following drawings and tables.

Embodiment 1

A liquid crystal display device of Embodiment 1 is equipped with an active matrix substrate and a counter substrate. On the active matrix substrate, a plurality of TFTs each comprise an oxide semiconductor as a channel layer are arranged. On the counter substrate, color filters of red, green, and blue are arranged. The active matrix substrate and the counter substrate are bonded to each other by a sealing material. A gap between the substrates is filled with liquid crystals. In the following, a description is given on the production process of the liquid crystal display device of Embodiment 1 with reference to drawings.

(Production Process of Active Matrix Substrate)

FIGS. 1 to 5 are flowcharts of the production process of the active matrix substrate in the liquid crystal display device of Embodiment 1.

Figure 1:
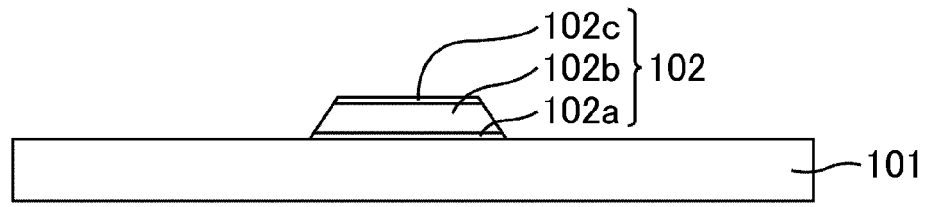
FIG. 1 is a flowchart of the production process of an active matrix substrate in a liquid crystal display device of Embodiment 1.

With reference to FIG. 1, a description is given on a method for forming a scanning wiring 102 in which scanning wiring layers 102a, 102b, and 102c are stacked.

First, materials of the scanning wiring layers 102a, 102b, and 102c are sequentially deposited on a glass substrate 101 by sputtering to form a multilayer film. Then, the multilayer film is patterned by photolithography that includes wet etching and resist stripping. In this manner, the scanning wiring 102 in which scanning wiring layers 102a, 102b, and 102c are stacked is formed. As the materials of the scanning wiring layers 102a and 102c, Ti may be used, for example. The thickness of the scanning wiring layers 102a and 102c may be set to be about 30 to 150 nm, for example. As the material of the scanning wiring layer 102b, Al may be used, for example. The thickness of the scanning wiring layer 102b may be set to about 200 to 500 nm, for example. In the present embodiment, the scanning wiring 102 has a multilayer structure of Ti/Al/Ti. A part of the scanning wiring 102 serves as a gate electrode of a TFT.

Figure 2:
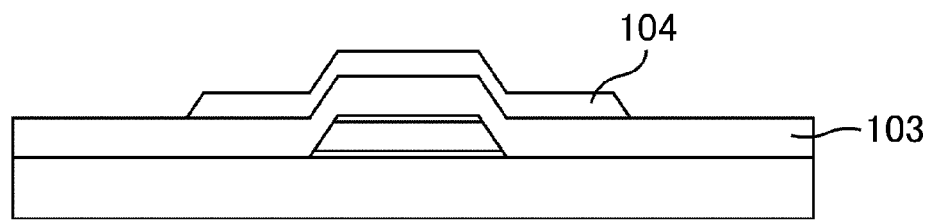
FIG. 2 is a flowchart of the production process of the active matrix substrate in the liquid crystal display device of Embodiment 1.

With reference to FIG. 2, a description is given on a method for forming an insulating layer 103 and an oxide semiconductor layer 104.

First, the insulating layer 103 is formed to cover the glass substrate 101 and the scanning wiring 102. For example, a $SiN_x$ layer may be used as the insulating layer 103. The thickness of the insulating layer 103 is set to, for example, about 200 to 500 nm. A part of the insulating layer 103 serves as a gate insulating film of the TFT. Then, a material of the oxide semiconductor layer 104 is deposited by sputtering to form a film. The film was patterned by photolithography that includes wet etching and resist stripping. In this manner, the oxide semiconductor layer 104 is formed. A part of the oxide semiconductor layer 104 serves as a channel layer of the TFT. In the present embodiment, an oxide semiconductor film (IGZO film) containing In, Ga, Zn, and O is used as the oxide semiconductor layer 104. The thickness of the oxide semiconductor layer 104 is set to, for example, about 10 to 300 nm.

Figure 3:
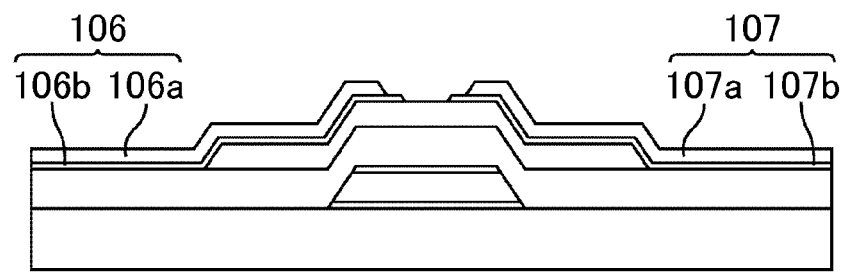
FIG. 3 is a flowchart of the production process of the active matrix substrate in the liquid crystal display device of Embodiment 1.

With reference to FIG. 3, a description is given on a method for forming a signal wiring 106 in which signal wiring layers 106a and 106b are stacked and a drain electrode 107 in which drain electrode layers 107a and 107b are stacked. Here, a description is given with regard to a case where the signal wiring 106 and the drain electrode 107 are made of the same material. However, the material of the signal wiring 106 may be different from that of the drain electrode 107.

First, the material of the signal wiring layer 106a and of the drain electrode layer 107a is deposited and the material of the signal wiring layer 106b and of the drain electrode layer 107b is deposited thereon by sputtering to form a multilayer film. Then, the multilayer film is patterned by photolithography that includes wet etching and resist stripping. In this manner, the signal wiring 106 in which the signal wiring layers 106a and 106b are stacked and the drain electrode 107 in which the drain electrode layers 107a and 107b are stacked are formed. Apart of the signal wiring 106 serves as a source electrode of the TFT. The material of the signal wiring layer 106a and of the drain electrode layer 107a may be Ti, for example. The thickness of the signal wiring layer 106a and of the drain electrode 107a is set to, for example, about 30 to 150 nm. Further, the material of the signal wiring layer 106b and of the drain electrode 107b may be Al, for example. The thickness of the signal wiring layer 106b and of the drain electrode 107b is set to, for example, about 50 to 400 nm. In the present embodiment, the signal wiring 106 and the drain electrode 107 each have a multilayer structure of Al/Ti. By these processes, a TFT comprising a gate electrode, a gate insulating film, a channel layer, a source electrode and the drain electrode 107 is formed.

Figure 4:
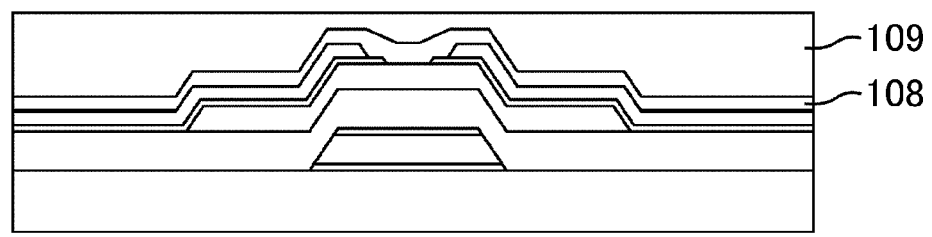
FIG. 4 is a flowchart of the production process of the active matrix substrate in the liquid crystal display device of Embodiment 1.

Now, a description is given on a method for forming a protection layer 108 and an interlayer insulating film 109 with reference to FIG. 4.

First, the material of the protection layer 108 is deposited and then the material of the interlayer insulating film 109 is deposited thereon by a CVD method or sputtering to form a multilayer film. The multilayer film is patterned by photolithography including dry etching and resist stripping to form the protection layer 108 and the interlayer insulating film 109. For example, a SiOx layer may be used as the protection layer 108. The thickness of the protection layer 108 is set to, for example, about 50 to 300 nm. The material of the interlayer insulating film 109 may be, for example, a photosensitive resin.

Figure 5:
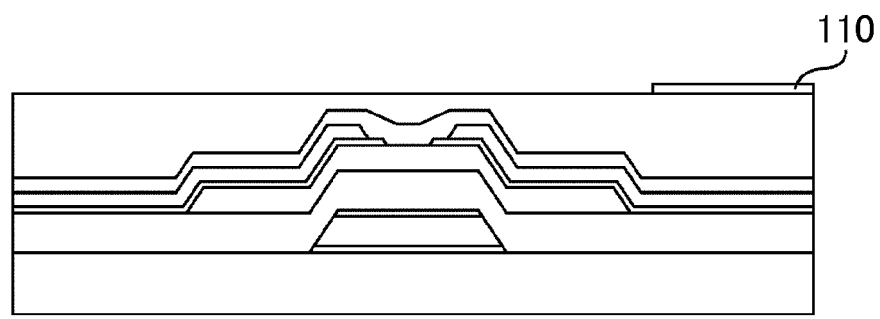
FIG. 5 is a flowchart of the production process of the active matrix substrate in the liquid crystal display device of Embodiment 1.

Now, a description is given on a method for forming a pixel electrode 110 with reference to FIG. 5.

First, the material of the pixel electrode 110 is deposited by sputtering to form a film. Then, the film is patterned by photolithography including wet etching and resist stripping to form the pixel electrode 110. The material of the pixel electrode 110 may be, for example, ITO (Indium Tin Oxide). The thickness of the pixel electrode 110 is set to, for example, about 50 to 200 nm.

The active matrix substrate provided in the liquid crystal display device of Embodiment 1 is produced through the processes having described above with reference to FIGS. 1 to 5.

(Production Process of Counter Substrate)

Figure 6:
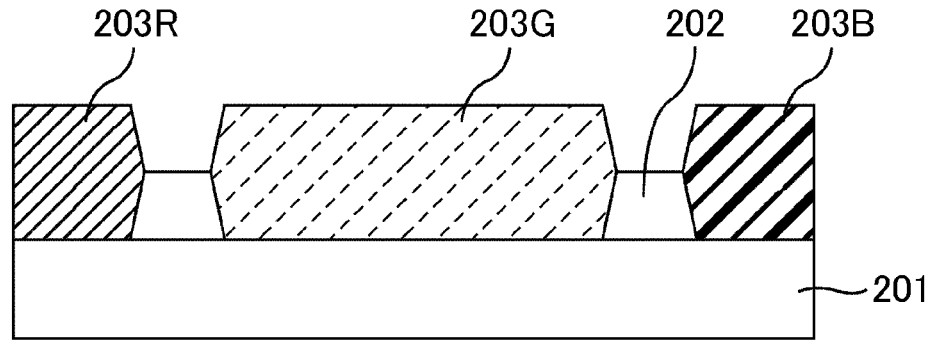
FIG. 6 is a flowchart of the production process of a counter substrate in the liquid crystal display device of Embodiment 1.
Figure 7:
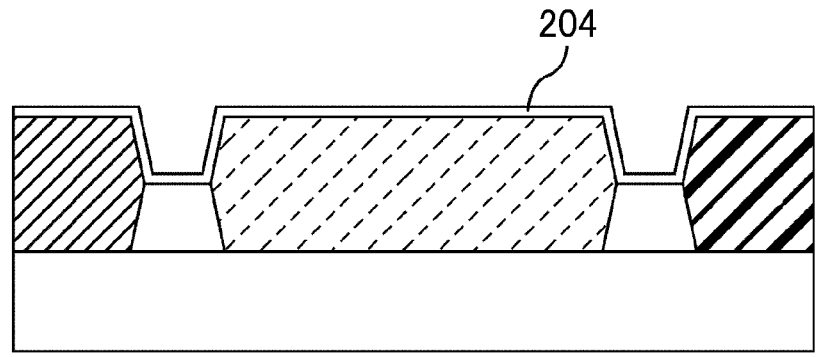
FIG. 7 is a flowchart of the production process of a counter substrate in the liquid crystal display device of Embodiment 1.
Figure 8:
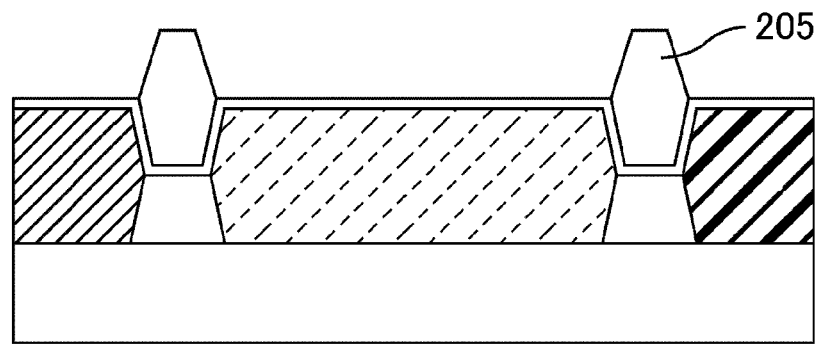
FIG. 8 is a flowchart of the production process of a counter substrate in the liquid crystal display device of Embodiment 1.

Here, a description is given on a method for forming a counter substrate provided in the liquid crystal display device of the present embodiment. FIGS. 6 to 8 are flowcharts each illustrating the production process of a counter substrate in the liquid crystal display device of Embodiment 1.

First, a description is given on a method for forming a black matrix (BM) 202, a red color filter 203R, a green color filter 203G, and a blue color filter 203B with reference to FIG. 6.

A photosensitive resin containing pigments is patterned by photolithography to produce the BM 202, and red, green, and blue color filters 203R, 203G, and 203B. The production order may be BM 202 on a glass substrate 201 first, and then the red color filter 203R, the green color filter 203G, and the blue color filter 203B sequentially formed in regions defined by the BM 202. In this manner, the red color filter 203R, the green color filter 203G, and the blue color filter 203B are arranged on the glass substrate 201.

Now, a description is given on a method for forming a counter electrode 204 with reference to FIG. 7.

First, the material of the counter electrode 204 is deposited by sputtering to form a film. Then, the film is patterned by photolithography including wet etching and resist stripping to form the counter electrode 204. The material of the counter electrode 204 may be, for example, indium tin oxide (ITO). The thickness of the counter electrode 204 is set to, for example, about 50 to 200 nm.

Here, a description is given on a method for forming a photo spacer 205 with reference to FIG. 8.

A photosensitive resin is patterned by photolithography to produce the photo spacer 205.

The counter substrate provided in the liquid crystal display device of Embodiment 1 is produced through the processes having described above with reference to FIGS. 6 to 8.

(Panel Production Process)

Here, a description is given on the process of bonding the active matrix substrate and the counter substrate which have been produced by the above-described processes, and on the process of encapsulating liquid crystals.

First, an alignment film is formed by printing on each of the surfaces of the active matrix substrate and of the counter substrate. The material of the alignment film may be, for example, a polyimide resin.

After a sealing material is positioned by printing on one of the active matrix substrate and the counter substrate, liquid crystals are dripped. Then, the active matrix substrate and the counter substrate are bonded to each other.

Next, the substrates bonded in the above process are separated by dice cutting. Accordingly, a liquid crystal display panel provided in the liquid crystal display device of the present embodiment is produced.

Then, common members such as a driving device are mounted on the liquid crystal display panel produced in the above processes. Accordingly, the liquid crystal display device of the present embodiment is produced.

Here, the description has been given on a case where the scanning wiring has a multilayer structure of Ti/Al/Ti. However, the scanning wiring may have a multilayer structure of Cu/Ti. Similarly, the drain electrode may have a multilayer structure of Cu/Ti.

It is to be noted that the BM 202, the red color filter 203R, the green color filter 203G, and the blue color filter 203B may be formed not on the counter substrate but on the active matrix substrate.

Moreover, the display device of the present invention is not limited to a liquid crystal display device, and may also be applied to display devices other than the liquid crystal display device.

Embodiment 2

In the present embodiment, a layer for protecting a channel layer of a TFT (Channel protection layer) is provided. FIGS. 9 to 13 are flowcharts each illustrating the production process of an active matrix substrate in a liquid crystal display device of Embodiment 2. Hereinafter, a description is given on the production process of an active matrix substrate provided with a channel protection layer.

Figure 9:
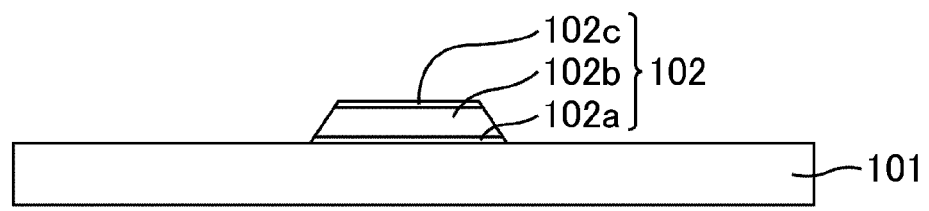
FIG. 9 is a flowchart of the production process of an active matrix substrate in a liquid crystal display device of Embodiment 2.
Figure 10:
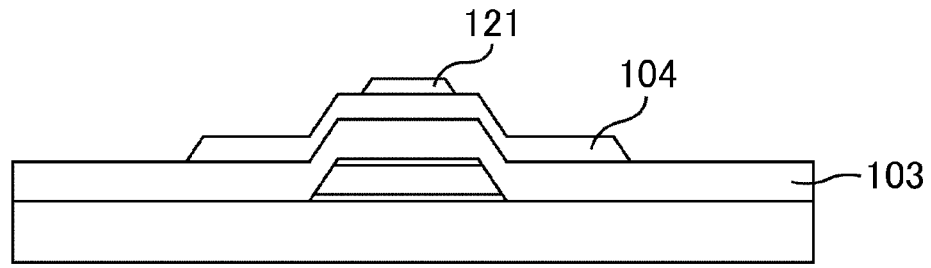
FIG. 10 is a flowchart of the production process of the active matrix substrate in the liquid crystal display device of Embodiment 2.

First, as illustrated in FIGS. 9 and 10, a scanning wiring 102, an insulating layer 103, and an oxide semiconductor layer 104 are formed on a glass substrate 101 by the method described with reference to FIGS. 1 and 2. Then, the material of a channel protection layer 121 is deposited by sputtering to form a film. The film is patterned by photolithography including dry etching and resist stripping. In this manner, the channel protection layer 121 is formed as illustrated in FIG. 10. The material of the channel protection layer 121 may be, for example, $SiO_2$. The thickness of the channel protection layer 121 is set to, for example, about 20 to 500 nm.

Figure 11:
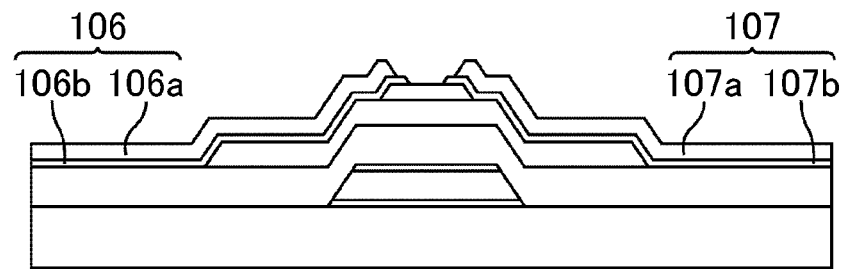
FIG. 11 is a flowchart of the production process of the active matrix substrate in the liquid crystal display device of Embodiment 2.
Figure 12:
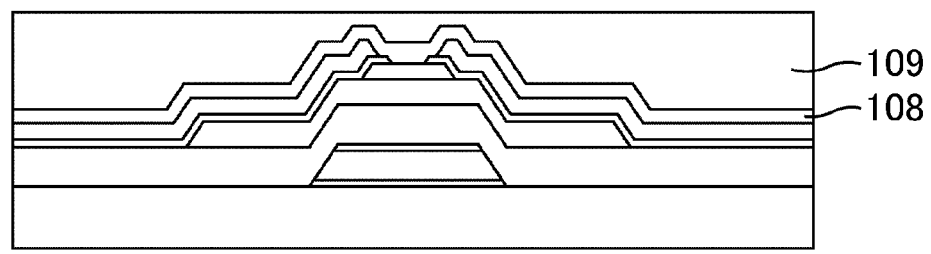
FIG. 12 is a flowchart of the production process of the active matrix substrate in the liquid crystal display device of Embodiment 2.
Figure 13:
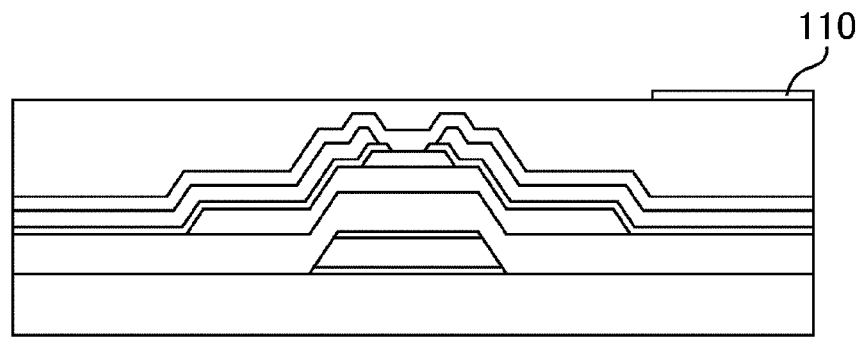
FIG. 13 is a flowchart of the production process of the active matrix substrate in the liquid crystal display device of Embodiment 2.

Then, the process illustrated in FIGS. 11 to 13 are carried out by the method described with reference to FIGS. 3 to 5 to produce the active matrix substrate provided with the channel protection layer 121 (channel protection film). Accordingly, the channel protection layer 121 reduces damage to the oxide semiconductor 104 in production process of an active matrix substrate and also increases the reliability of the TFT. Moreover, oxygen desorption from the oxide semiconductor layer 104 during the production can be suppressed.

The liquid crystal display device of Embodiment 2 has a similar configuration as the liquid crystal display device of Embodiment 1 except that the channel protection layer 121 is provided. Therefore, a description of the production of a counter substrate and the following processes is omitted here.

EXAMPLES 1 TO 5

The TFTs of Examples 1 to 5 each had a channel protection layer and were produced by the method described in Embodiment 2. Oxide semiconductors (IGZO film) having different compositions were used as the channel layers of the TFTs of Examples 1 to 5. Hereinbelow, the compositions of the oxide semiconductors provided in the TFTs of Examples 1 to 5 are shown. The oxygen content is also mentioned for determining if the oxygen content of the oxide semiconductor has an influence.

Example 1 In:Ga:Zn:O=4:5:1:8
Example 2 In:Ga:Zn:O=4:5:1:12
Example 3 In:Ga:Zn:O=4:5:1:13
Example 4 In:Ga:Zn:O=4:5:1:14
Example 5 In:Ga:Zn:O=5:5:1:16

Figure 14:
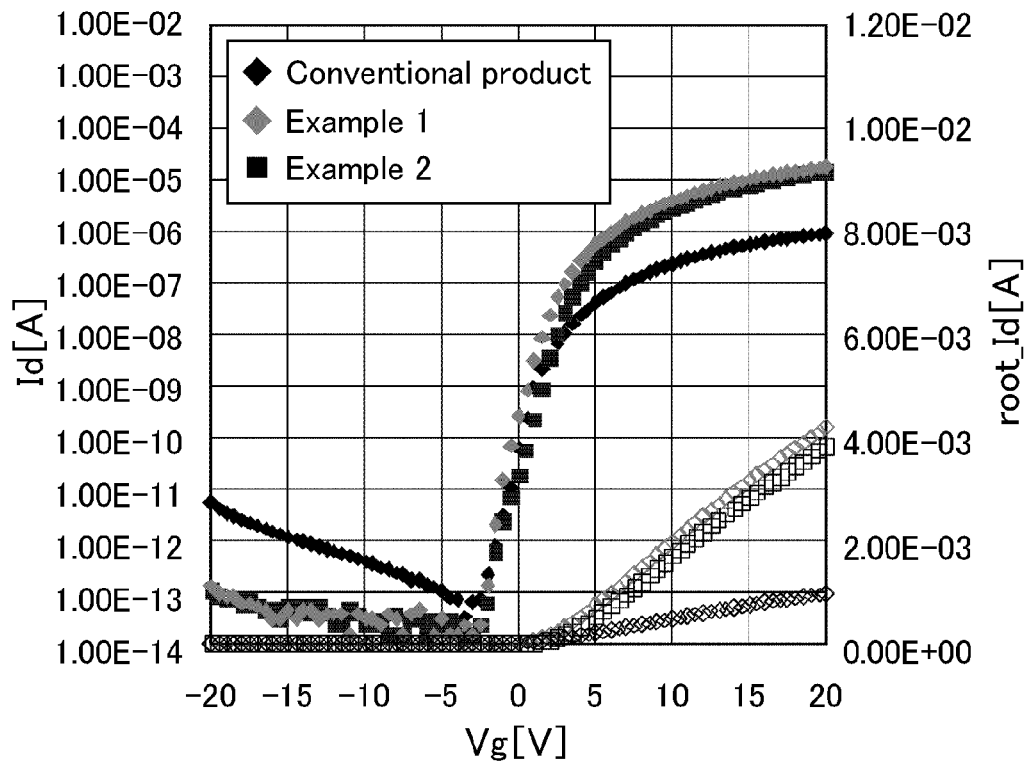
FIG. 14 is a graph showing electric properties of TFTs of Examples 1 and 2.
Figure 15:
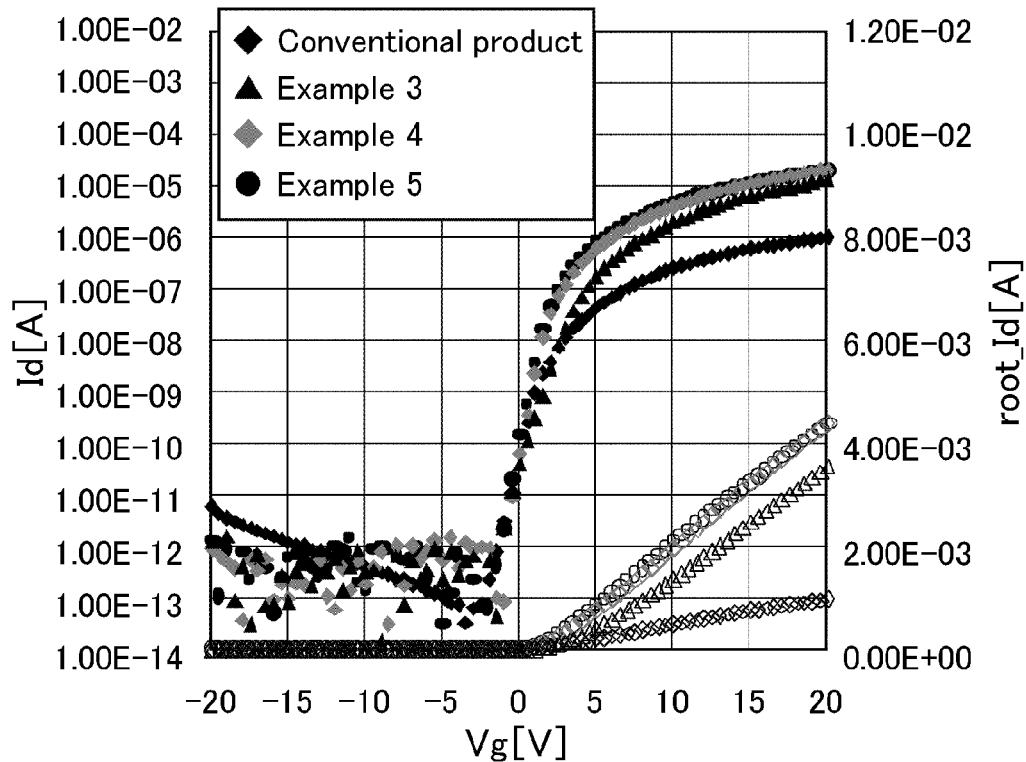
FIG. 15 is a graph showing electric properties of TFTs of Examples 3 to 5.

FIG. 14 is a graph showing electric properties of TFTs of Examples 1 and 2. FIG. 15 is a graph showing electric properties of TFTs of Examples 3 to 5. In FIGS. 14 and 15, the result of a TFT comprising a channel layer of amorphous silicon is mentioned as a "conventional product" for comparison. Table 1 shows the threshold voltage of the TFTs of Examples 1 to 5 and the mobility of the oxide semiconductors provided in the TFTs.

TABLE 1

| | Conventional product | Example 1 | Example 2 | Example 3 | Example 4 | Example 5 |
|---|---|---|---|---|---|---|
| Threshold voltage (V) | 1.23 | 1.97 | 2.85 | 3.61 | 2.19 | 1.34 |
| Mobility ($cm^2/Vs$) | 0.4 | 8.02 | 7.44 | 6.13 | 8.37 | 7.64 |

FIGS. 14 and 15 and Table 1 indicate that the TFTs of Examples 1 to 5 have excellent electric properties.

Here, the TFTs of Examples 1 to 5 were each provided with a channel protection layer. The TFT provided with no channel protection layer produced by the method described in Embodiment 1 also has similarly excellent electric properties.

EXAMPLES 6 TO 13

TFTs of Examples 6 to 13 each included a channel protection layer and were produced by the method described in Embodiment 2. Table 2 shows the resistivity of oxide semiconductors provided in the TFTs of Examples 6 to 13 and the evaluation results of the electric properties of the TFTs. Here, the resistivity values mentioned in Table 2 were obtained by measuring the baked oxide semiconductors.

TABLE 2

| | Composition of target | Resistivity ($\Omega \cdot cm$) | TFT property |
|---|---|---|---|
| Example 6 | In:Ga:Zn = 10:1:2 | $2.0 \times 10^{-2}$ | ▲ |
| Example 7 | | $4.0 \times 10^4$ | ○ |
| Example 8 | | $1.0 \times 10^5$ | ○ |
| Example 9 | | $7.0 \times 10^4$ | ○ |
| Example 10 | In:Ga:Zn = 7:1:1 | $3.0 \times 10^5$ | ○ |
| Example 11 | | $6.0 \times 10^9$ | ○ |
| Example 12 | | $6.0 \times 10^{10}$ | ○ |
| Example 13 | | $3.0 \times 10^6$ | ○ |

In Table 2, the TFT property indicates whether the TFT could exert its switching function sufficiently. The evaluation "○" indicates that the TFT could exert its switching function sufficiently and the evaluation "▲" indicates that the TFT could not exert its switching function sufficiently. As shown in Table 2, the TFT of Example 6 had a low resistivity and could not exert its switching function sufficiently, compared to the TFTs of Examples 7 to 13. This result shows that the resistivity of $4.0 \times 10^4$ $\Omega \cdot cm$ or more is required for sufficient exertion of the switching function in the case of the TFT comprising an IGZO film as a channel layer.

Here, the TFTs of Examples 6 to 13 each included a channel protection layer. Similar measuring results are obtained also with regard to the TFT including no channel protection layer produced by the method described in Embodiment 1.

(Composition Dependence of Chemical Resistance of Oxide Semiconductor)

Figure 16:
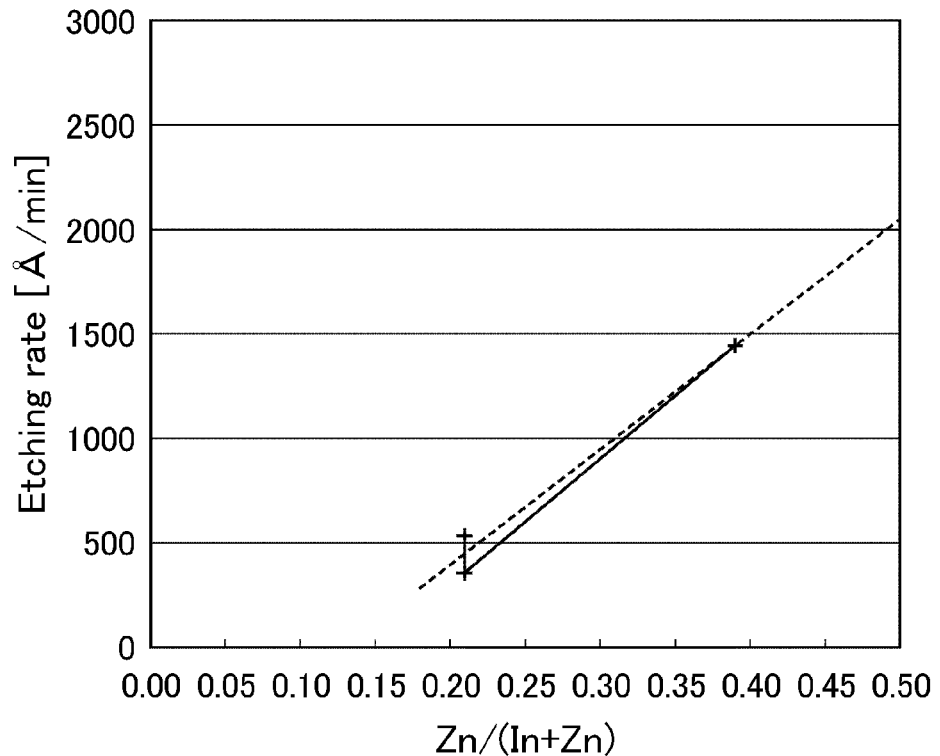
FIG. 16 is a graph showing the etching rate of oxide semiconductors having different In and Zn atomic compositions.

To determine the composition dependence of the chemical resistance of the oxide semiconductor, the etching rates of a plurality of oxide semiconductors having different compositions were measured. FIG. 16 is a graph showing the etching rates of oxide semiconductors having different In and Zn atomic compositions. Table 3 shows the results of FIG. 16. Oxalic acid (3% in concentration) was used as a chemical for measurement of the etching rate.

TABLE 3

| Zn/(In + Zn) | Etching rate (Å/min) |
|---|---|
| 0.210 | 530 |
| 0.210 | 350 |
| 0.390 | 1440 |

As shown in FIG. 16 and Table 3, the etching rate is increased along with an increase in the Zn atomic composition. When the etching rate is high, the oxide semiconductor is likely to be damaged during the process in which a chemical fluid is used such as the patterning process. Accordingly, in order to secure sufficient process resistance, the Zn atomic composition in the oxide semiconductor satisfies the equation of $0.01 \leq Zn/(In+Zn) \leq 0.22$.

(Composition Dependence of Mobility of Oxide Semiconductor)

Figure 17:
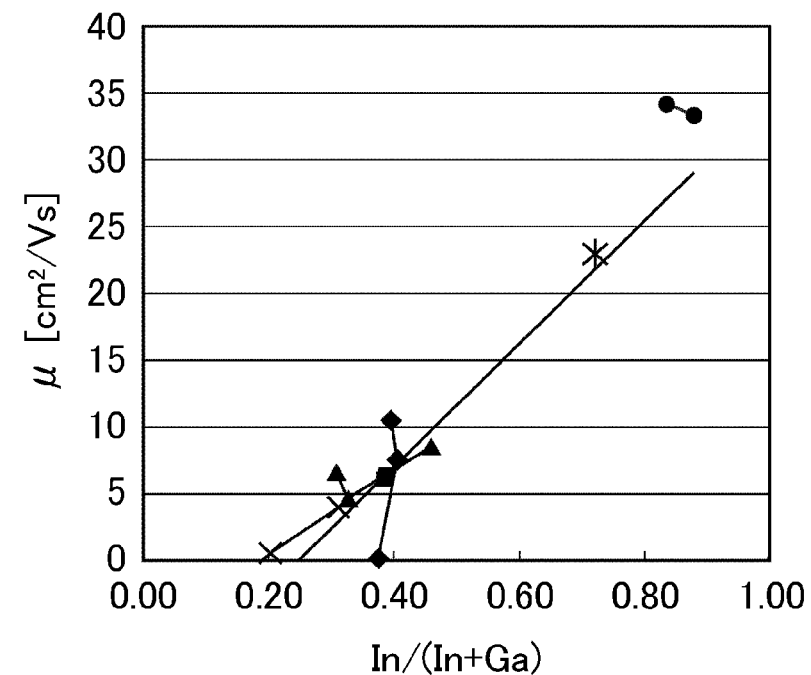
FIG. 17 is a graph showing the mobility of oxide semiconductors having different In and Zn atomic compositions.

To determine the composition dependence of the mobility of the oxide semiconductor, the mobility of a plurality of oxide semiconductors having different compositions was measured. FIG. 17 is a graph showing the mobility of oxide semiconductors having different In and Ga atomic compositions. Table 4 shows the results of FIG. 17. The leftmost columns of Table 4 show the composition ratios of targets (In:Ga:Zn) used to form the oxide semiconductors.

TABLE 4

| Composition of target | | $O_2$ (Pa) | | | |
|---|---|---|---|---|---|
| (In:Ga:Zn) | | 0.01 | 0.05 | 0..3 | 0.5 |
| 1:6:1 | Mobility (cm$^2$/Vs) | | 0.45 | 3.92 | |
| | In/(In + Ga) | | 0.2 | 0.31 | |
| 3:5:1 | Mobility (cm$^2$/Vs) | 8.45 | 4.55 | 6.48 | |
| | In/(In + Ga) | 0.46 | 0.33 | 0.31 | |
| 2:3:1 | Mobility (cm$^2$/Vs) | 6.5 | 6.1 | | |
| | In/(In + Ga) | 0.39 | 0.38 | | |
| 4:5:1 | Mobility (cm$^2$/Vs) | 10.4 | 7.5 | | 0.04 |
| | In/(In + Ga) | 0.40 | 0.41 | | 0.38 |
| 8:5:1 | Mobility (cm$^2$/Vs) | Unmeasurable | Unmeasurable | 23 | |
| | In/(In + Ga) | | | 0.65 | 0.72 |
| 10:2:1 | Mobility (cm$^2$/Vs) | Unmeasurable | 34.2 | 33.3 | |
| | In/(In + Ga) | | | 0.84 | 0.88 |

As shown in FIG. 17 and Table 4, if the Ga atomic composition is large and the In atomic composition is small, the mobility of such an oxide semiconductor tends to be lowered. The oxide semiconductor preferably has a mobility of 0.1 cm$^2$/Vs or more so that the TFT comprising the oxide semiconductor as a channel layer sufficiently exerts the electric property. The results shown in FIG. 17 indicate that the oxide semiconductor having a mobility of 0.1 cm$^2$/Vs or more has the composition in a range of $0.25 \leq In/(In+Ga)$. Too high mobility of the oxide semiconductor increases the off-state current, leading to insufficient exertion of the switching property by the TFT. The atomic composition preferably satisfies the equation of $0.01 \leq In/(In+Ga) \leq 0.60$ for securing a margin against the increase in the off-state current. Accordingly, the In atomic composition of the oxide semiconductor preferably satisfies the equation of $0.25 \leq In/(In+Ga) \leq 0.60$.

The above-mentioned results clarifies that, in the oxide semiconductor containing In, Ga, Zn, and O, the atomic composition preferably satisfies the equation of $0.01 \leq Zn/(In+Zn) \leq 0.22$ and the equation of $0.25 \leq In/(In+Ga)$. More preferably, the atomic composition satisfies the equation of $0.01 \leq Zn/(In+Zn) \leq 0.22$ and the equation of $0.25 \leq In/(In+Ga) \leq 0.60$.

(Method for Determining Composition of Oxide Semiconductor)

Examples of the method for determining the composition of the oxide semiconductor include Auger electron spectroscopy (AES) and X-ray photoelectron spectroscopy (XPS). In the present embodiment, the composition of the constituent atoms at the depth of about 20 nm from the surface of the oxide semiconductor 104 was measured by using an Auger electron spectrometer (produced by JEOL Ltd., model No. JAMP-9500F). The detection peaks of the constituent atoms including Ga, In, Zn, and O were determined under the AES measurement conditions including: electron beam irradiation of 5 kV and 5 nA; test sample at an inclination of 75 degrees; neutralization with Ar ion at 10 eV and 1 µA; energy resolution of the detector of de/E=0.35%; detection energy step of 1.0 eV.

Here, a description is given on the principle of AES analysis. In the AES analysis, an electron beam is radiated to the measurement site of the sample and a spectrum is obtained from the kinetic energy and the detection intensity of Auger electrons emitted from the surface. Each element has the peculiar peak position and the peculiar shape of the spectrum. Therefore, elemental analysis is carried out by identifying the element from the peak position and the shape of the spectrum and calculating the atomic concentration in the material based on the spectral intensity (amplitude). Also, since each atomic bond uniquely affects the peak position and the shape of the spectrum, the chemical bonding state (e.g. oxidation state) of each element can be analyzed.

Since the auger electrons constitute only apart of a huge amount of detected electrons, the accuracy of the detected amount is influenced by the background of low-frequency components. Therefore, as commonly employed, the spectrum was differentiated so that the low-frequency components are removed, and then the composition ratio was calculated from the peak intensity of each element by using a sensitivity coefficient (value of a pure element attached to the device) that is peculiar to each element.

The peak intensity and the shape of each element are varied if the chemical bonding state is significantly changed. Therefore, it is preferable to correct the sensitivity coefficient for highly accurate calculation of the composition ratio. Accordingly, in calculation of the composition ratio, Rutherford Backscattering Spectrometry (RBS) and Particle Induced X-ray Emission (PIXE) were conducted, and the sensitivity coefficient of each element was corrected by using the obtained values.

The embodiments described above may be employed in combination without departing from the scope of the present invention.

The present application claims priority to Patent Application No. 2009-200341 filed in Japan on Aug. 31, 2009 under the Paris Convention and provisions of national law in a designated State, the entire contents of which are hereby incorporated by reference.

EXPLANATION OF NUMERALS AND SYMBOLS

101, 201 Glass substrate
102a, 102b, 102c Scanning wiring layer
102 Scanning wiring
103 Insulating layer
104 Oxide semiconductor layer
106a, 106b Signal wiring layer
106 Signal wiring
107a, 107b Drain electrode layer 107 Drain electrode
108 Protection layer
109 Interlayer insulating film
110 Pixel electrode
121 Channel protection layer
202 Black matrix (BM)
203R, 203G, 203B Color filter (CF)
204 Counter electrode
205 Photo spacer

The invention claimed is:

1. An oxide semiconductor for a thin film transistor, wherein
the oxide semiconductor contains Ga, In, Zn, and O as constituent atoms,
the oxide semiconductor has Zn atomic composition satisfying the equation of $0.01 \leq Zn/(In+Zn) \leq 0.22$, and
the oxide semiconductor has a resistivity of $4.0 \times 10^4 \Omega \cdot cm$ or more.

2. The oxide semiconductor according to claim 1, wherein the oxide semiconductor has In atomic composition satisfying the equation of $0.25 \leq In/(In+Ga) \leq 0.99$.

3. The oxide semiconductor according to claim 1, wherein the oxide semiconductor has In atomic composition satisfying the equation of $0.01 \leq In/(In+Ga) \leq 0.60$.

4. A thin film transistor comprising
a channel layer formed of the oxide semiconductor according to claim 1.

5. A display device equipped with
the thin film transistor according to claim 4.

* * * * *